US010886274B2

United States Patent
Park et al.

(10) Patent No.: US 10,886,274 B2
(45) Date of Patent: Jan. 5, 2021

(54) TWO-TERMINAL VERTICAL 1T-DRAM AND METHOD OF FABRICATING THE SAME

(71) Applicant: Industry-University Cooperation Foundation Hanyang University, Seoul (KR)

(72) Inventors: Jea Gun Park, Seongnam-si (KR); Seung Hyun Song, Seoul (KR); Min Won Kim, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 16/465,392

(22) PCT Filed: Nov. 30, 2017

(86) PCT No.: PCT/KR2017/013926
§ 371 (c)(1),
(2) Date: May 30, 2019

(87) PCT Pub. No.: WO2018/101770
PCT Pub. Date: Jun. 7, 2018

(65) Prior Publication Data
US 2020/0027882 A1    Jan. 23, 2020

(30) Foreign Application Priority Data
Dec. 1, 2016  (KR) .......... 10-2016-0162666

(51) Int. Cl.
*H01L 27/108* (2006.01)
*H01L 27/102* (2006.01)
*H01L 29/87* (2006.01)

(52) U.S. Cl.
CPC ........ *H01L 27/108* (2013.01); *H01L 27/1027* (2013.01); *H01L 29/87* (2013.01)

(58) Field of Classification Search
CPC . H01L 27/108; H01L 27/10802; H01L 27/24; H01L 27/2409; H01L 27/1023
See application file for complete search history.

(56) References Cited

U.S. PATENT DOCUMENTS 8,609,492 B2    12/2013  Beigel et al.
2008/0136040 A1  6/2008  Park et al.
(Continued)

FOREIGN PATENT DOCUMENTS

JP    2004-153189 A    5/2004
JP    2007-525004 A    8/2007
(Continued)

OTHER PUBLICATIONS

Notice of Allowance issued from Korean Patent Application No. 10-2016-0162666 dated Nov. 21, 2018.
(Continued)

*Primary Examiner* — Changhyun Yi
(74) *Attorney, Agent, or Firm* — Sughrue Mion, PLLC

(57) ABSTRACT

The present invention discloses a two-terminal vertical 1T-DRAM and a method of fabricating the same. According to one embodiment of the present invention, the two-terminal vertical 1T-DRAM includes a cathode layer formed of a first-type high-concentration semiconductor layer; a base region including a second-type low-concentration semiconductor layer formed on the cathode layer and a first-type low-concentration semiconductor layer formed on the second-type low-concentration semiconductor layer; and an anode layer formed of a second-type high-concentration semiconductor layer on the first-type low-concentration semiconductor layer.

14 Claims, 6 Drawing Sheets

(56) References Cited

U.S. PATENT DOCUMENTS

2010/0102372 A1    4/2010  Lee et al.
2013/0026562 A1*   1/2013  Beigel ................. H01L 29/0638
                                                    257/334

FOREIGN PATENT DOCUMENTS

| JP | 2008-34576 A     | 2/2008  |
| JP | 2009-514212 A    | 4/2009  |
| JP | 2013-165220 A    | 8/2013  |
| KR | 10-0806128 B1    | 2/2008  |
| KR | 10-2009-0021744 A| 3/2009  |
| KR | 10-1085155 B1    | 11/2011 |
| KR | 10-2011-0136532 A| 12/2011 |
| KR | 10-1201853 B1    | 11/2012 |
| KR | 10-2014-0037965 A| 3/2014  |
| KR | 10-2016-0035601 A| 3/2016  |

OTHER PUBLICATIONS

International Search Report for PCT/KR2017/013926 dated Feb. 8, 2018 (PCT/ISA/210).

\* cited by examiner

[FIG. 1]
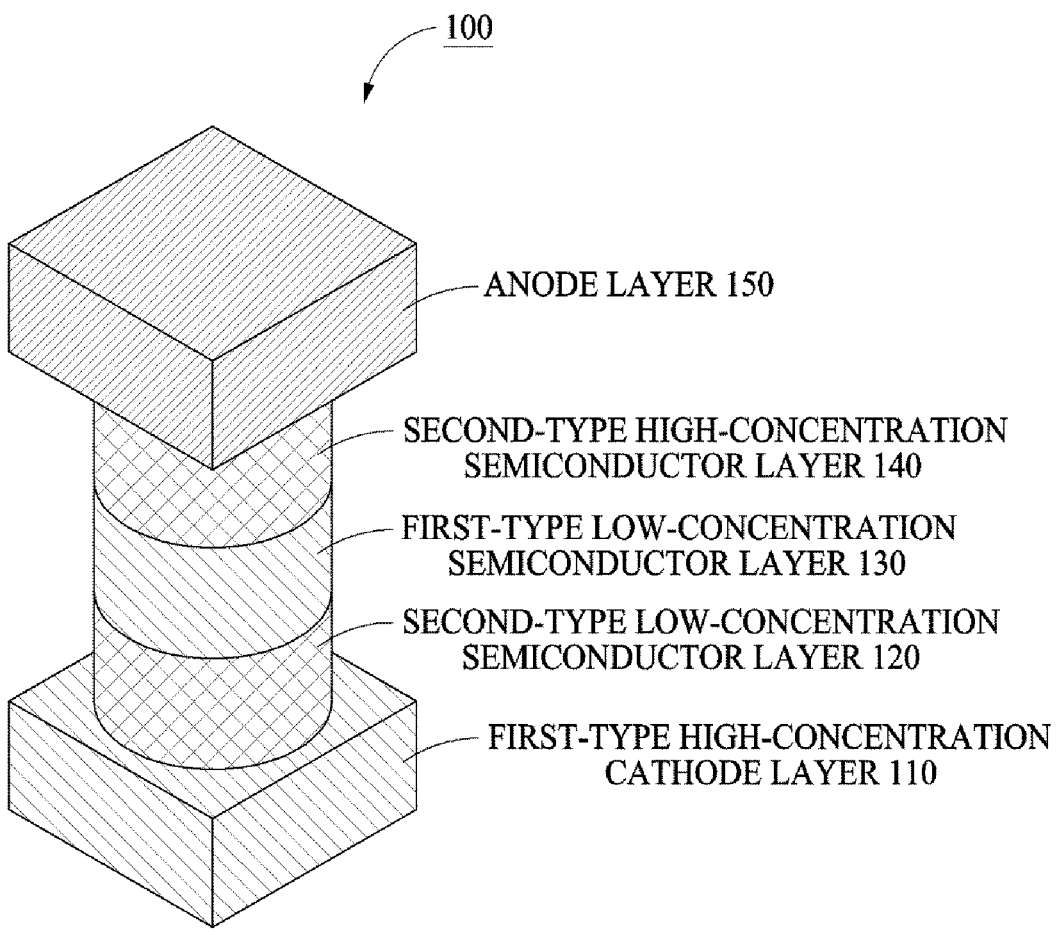

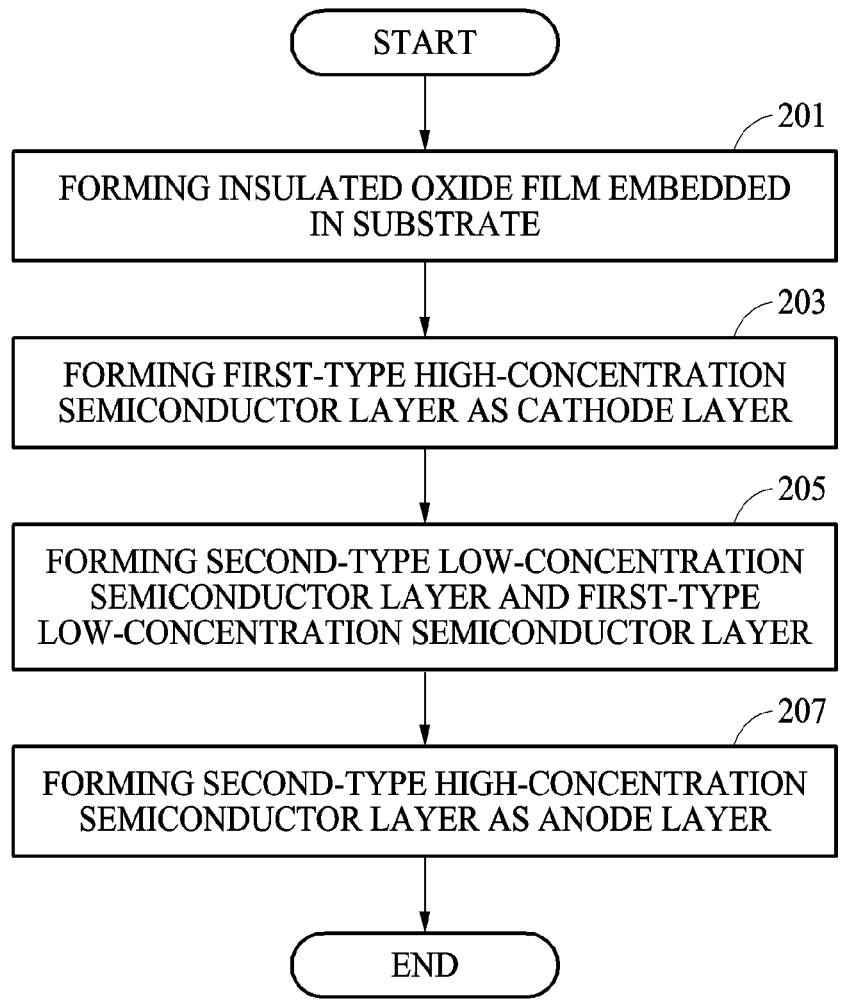

[FIG. 3]
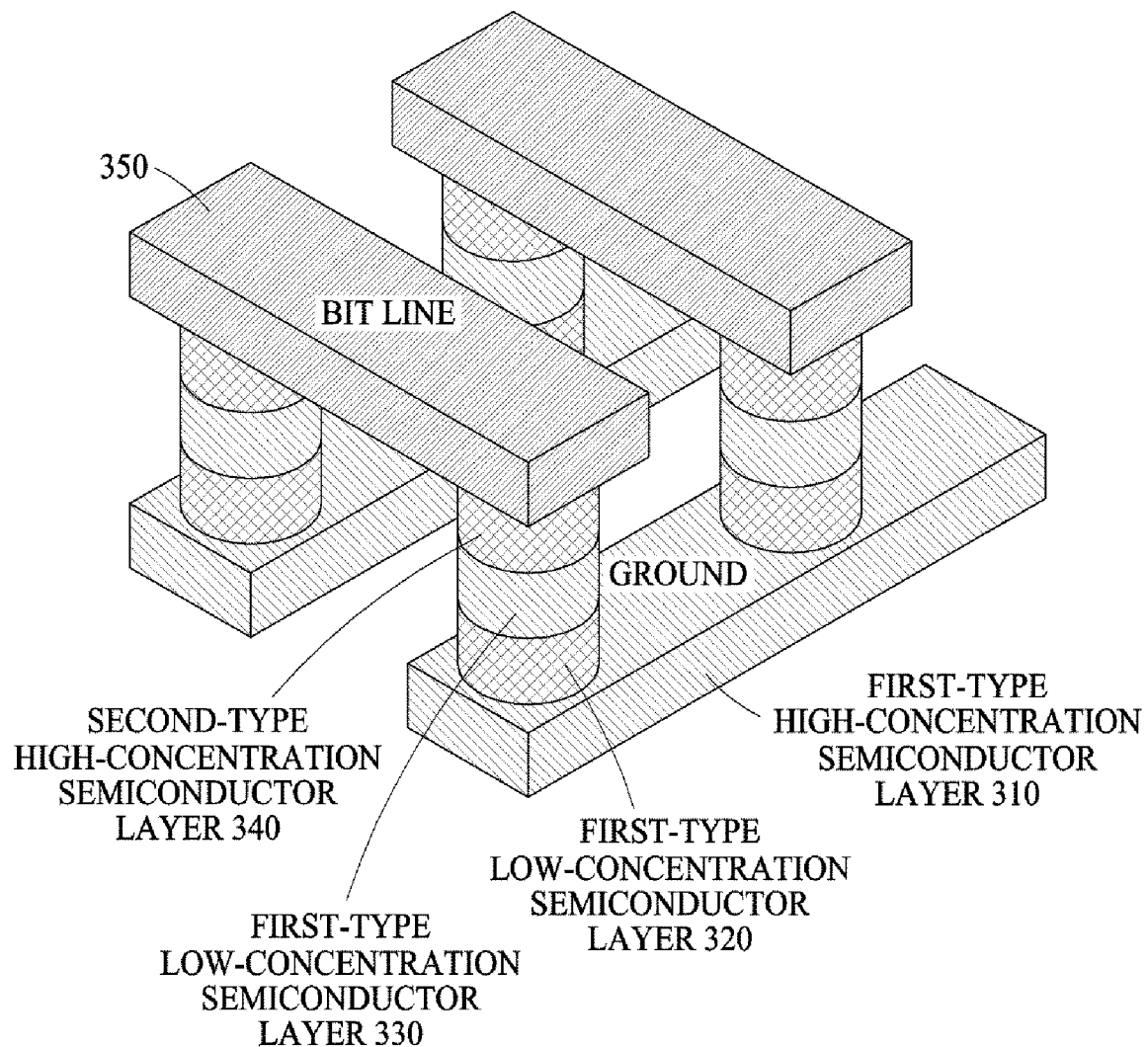

[FIG. 4A]
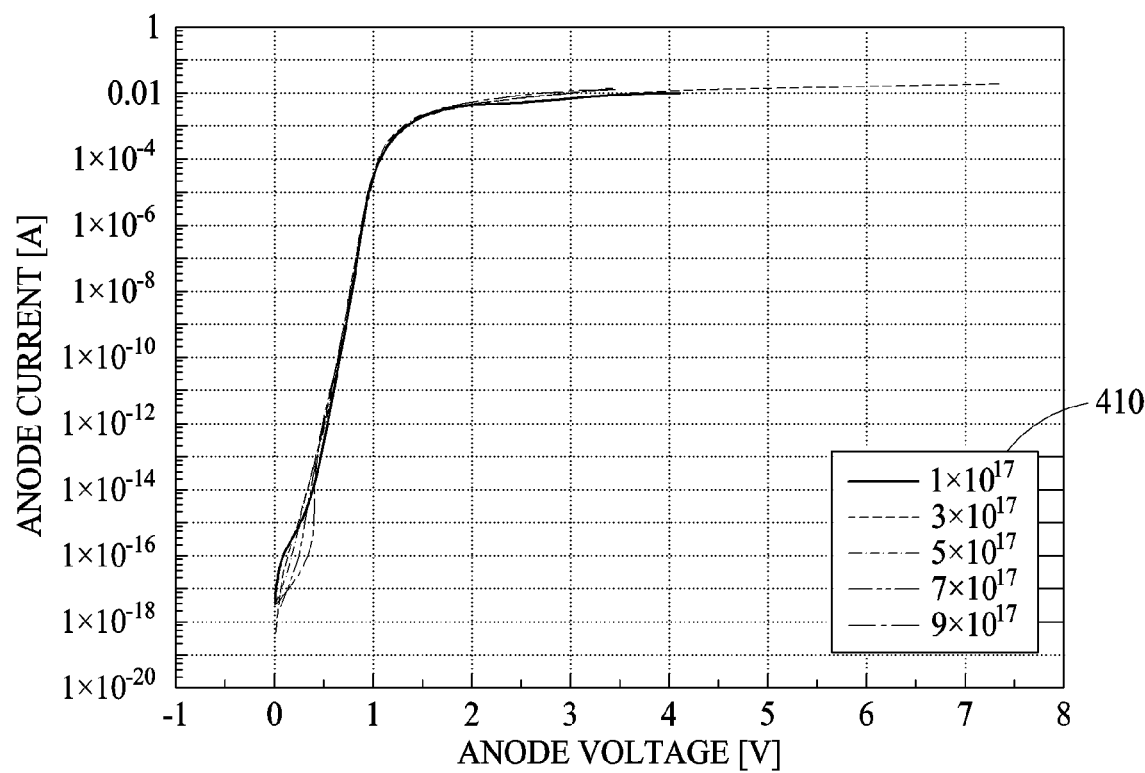

[FIG. 4B]
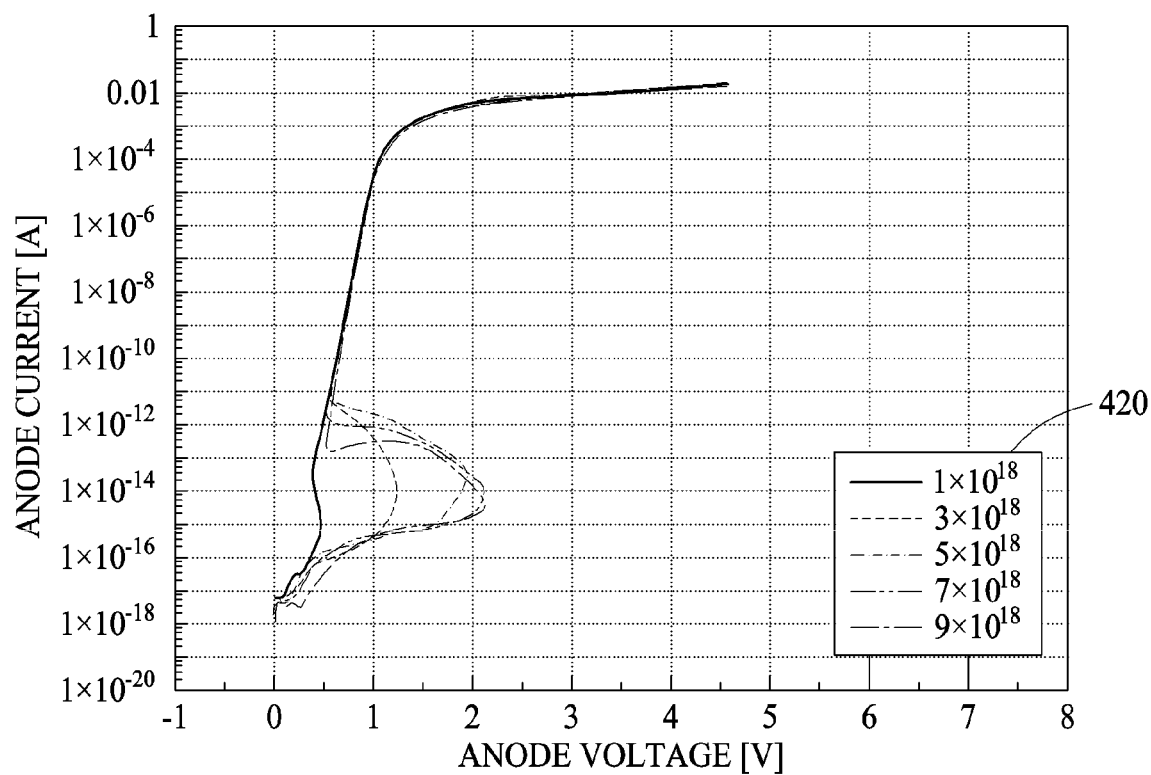

[FIG. 4C]
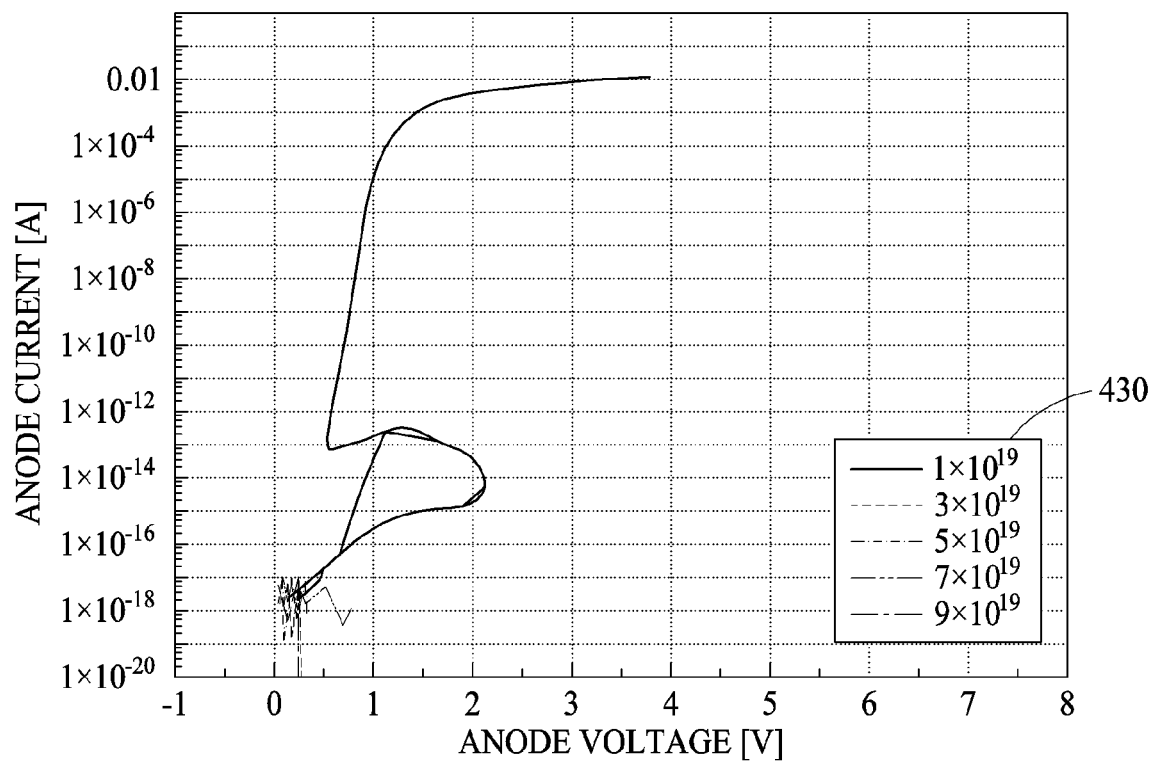

TWO-TERMINAL VERTICAL 1T-DRAM AND METHOD OF FABRICATING THE SAME

CROSS-REFERENCE TO RELATED APPLICATION

This application claims priority to Korean Patent Application No. 10-2016-0162666, filed on Dec. 1, 2016 in the Korean Intellectual Property Office, the disclosure of which is incorporated herein by reference.

TECHNICAL FIELD

The present invention relates to a two-terminal vertical 1T-DRAM and a method of fabricating the same, and more particularly, to a thyristor-based two-terminal vertical 1T-DRAM that adjusts the doping concentration of a base region including a first-type low-concentration semiconductor layer and a second-type low-concentration semiconductor layer to perform a memory operation according to the doping concentration of the base region and a method of fabricating the thyristor-based two-terminal vertical 1T-DRAM.

BACKGROUND ART

A dynamic random access memory (DRAM) cell according to the related art consists of one n-type metal-oxide-semiconductor field-effect transistor (n-MOSFET) and one cylinder-type capacitor. At present, the design rule (e.g., gate length) of a DRAM memory cell transistor is approximately 20 nm, the height of a cylinder-type capacitor is approximately 1.5 μm, and the degree of integration has been achieved up to 64 gigabytes.

However, to set the degree of integration of a DRAM memory cell to 1 terabit, the design rule of a transistor needs to be 10 nm or less. In addition, when the height of a capacitor is greater than 2.0 μm, physical limitations including a bridge phenomenon between cylinder-type capacitors may occur.

In particular, in the case of a DRAM, which is a main semiconductor memory, scaling down corresponding to a decrease of 2 nm on average has been realized every year in accordance with increasing demand for improvement in the performance of the semiconductor memory. With this trend, a 10 nm-scale DRAM may be fabricated by 2020, but developers may face physical limitations.

To solve these problems, a three-terminal thyristor-based 1-T DRAM having a p-n-p-n structure horizontally formed on a silicon on insulator (SOI) substrate and including two terminals of an anode and a cathode respectively disposed at both ends thereof and one terminal of a gate disposed at one of the middle base regions, i.e., including three terminals, has been developed.

When a high voltage is applied to the anode of a three-terminal thyristor-based 1T-DRAM, current flowing through a thyristor increases, and the gate capacitance of a p-base region is smaller than the sum of junction capacitances with n-regions located on both sides of the p-base region, so that the three-terminal thyristor-based 1T-DRAM may be in a state of "1" wherein the potential of the p-base region increases.

When a low voltage is applied to the anode of a three-terminal thyristor-based 1T-DRAM, current flowing through a thyristor decreases, and the gate capacitance of a p-base region is much larger than the sum of junction capacitances with n-regions located on both ends of the p-base region, so that the three-terminal thyristor-based 1T-DRAM may be in a state of "0" wherein the potential of the p-base region decreases.

A three-terminal thyristor-based 1T-DRAM performs a memory operation using a "0" or "1" state of a base region.

In addition, in a three-terminal thyristor-based 1T-DRAM, when the potential of a p-base region is high in a read state, latch-up is caused and the three-terminal thyristor-based 1T-DRAM may be in a state of "1". On the other hand, when the potential of a p-base region is low, blocking is caused and the three-terminal thyristor-based 1T-DRAM may be in a state of "0".

In a three-terminal thyristor-based 1-T DRAM according to the related art, a gate terminal for applying current to a base region is required. In addition, since the three-terminal thyristor-based 1-T DRAM is horizontally formed, the area required in forming the DRAM is increased, which limits scaling down.

Therefore, to overcome these physical limitations, a two-terminal vertical 1-T DRAM and a method of fabricating the same need to be developed.

RELATED ART DOCUMENTS

Patent Documents

[Patent Document 1] Korean Patent No. 10-1201853, "CAPACITOR-FREE DRAM CELL AND METHOD OF FABRICATING THE SAME"

[Patent Document 2] Korean Patent Application Publication No. 10-2016-0035601, "THYRISTOR MEMORY CELL INTEGRATED CIRCUIT"

[Patent Document 3] Korean Patent No. 10-1085155, "1T DRAM CELL DEVICE USING TUNNELING FIELD EFFECT TRANSISTOR"

DISCLOSURE

Technical Problem

Therefore, the present invention has been made in view of the above problems, and it is one object of the present invention to provide a two-terminal vertical 1T-DRAM and a method of fabricating the same.

It is another object of the present invention to provide a two-terminal vertical 1T-DRAM in which the doping concentration of a base region including a first-type low-concentration semiconductor layer and a second-type low-concentration semiconductor layer is adjusted by adding impurities to the first-type low-concentration semiconductor layer and the second-type low-concentration semiconductor layer and a method of fabricating the two-terminal vertical 1T-DRAM.

It is yet another object of the present invention to provide a two-terminal vertical 1T-DRAM in which, when the doping concentration of a base region increases from $1\times10^{18}$ $cm^{-3}$ to $1\times10^{19}$ $cm^{-3}$, latch-up is generated according to increase in the doping concentration of the base region, a latch-up voltage is increased, and a state of "high" is recorded in or read from the base region according to increase in a latch-up voltage and a method of fabricating the two-terminal vertical 1T-DRAM.

It is yet another object of the present invention to provide a two-terminal vertical 1T-DRAM in which, when the doping concentration of a base region increases from $1\times10^{16}$ $cm^{-3}$ to $1\times10^{17}$ $cm^{-3}$, latch-up is not generated according to increase in the doping concentration of the base region, and a state of "low" is recorded in or read from the base region and a method of fabricating the two-terminal vertical 1T-DRAM.

It is yet another object of the present invention to provide a two-terminal vertical 1T-DRAM in which a first-type low-concentration semiconductor layer and a second-type low-concentration semiconductor layer are each formed to have a thickness of 80 nm or more and a method of fabricating the two-terminal vertical 1T-DRAM.

Technical Solution

In accordance with one aspect of the present invention, provided is a two-terminal vertical 1T-DRAM including a cathode layer formed of a first-type high-concentration semiconductor layer; a base region including a second-type low-concentration semiconductor layer formed on the cathode layer and a first-type low-concentration semiconductor layer formed on the second-type low-concentration semiconductor layer; and an anode layer formed of a second-type high-concentration semiconductor layer on the first-type low-concentration semiconductor layer.

According to one embodiment of the present invention, the first-type high-concentration semiconductor layer may include one of an $n^+$-type semiconductor layer and a $p^+$-type semiconductor layer; and the second-type high-concentration semiconductor layer may include one of an $n^+$-type semiconductor layer and a $p^+$-type semiconductor layer, wherein, when the first-type high-concentration semiconductor layer is an $n^+$-type semiconductor layer, the second-type high-concentration semiconductor layer is a $p^+$-type semiconductor layer, and when the first-type high-concentration semiconductor layer is a $p^+$-type semiconductor layer, the second-type high-concentration semiconductor layer is an $n^+$-type semiconductor layer.

According to one embodiment of the present invention, the first-type low-concentration semiconductor layer may include one of a p-type semiconductor layer and an n-type semiconductor layer; and the second-type low-concentration semiconductor layer may include one of a p-type semiconductor layer and an n-type semiconductor layer, wherein, when the first-type low-concentration semiconductor layer is a p-type semiconductor layer, the second-type low-concentration semiconductor layer is an n-type semiconductor layer, and when the first-type low-concentration semiconductor layer is an n-type semiconductor layer, the second-type low-concentration semiconductor layer is a p-type semiconductor layer.

According to one embodiment of the present invention, the doping concentration of the base region may increase from $1 \times 10^{16}$ cm$^{-3}$ to $1 \times 10^{17}$ cm$^{-3}$ or from $1 \times 10^{18}$ cm$^{-3}$ to $1 \times 10^{19}$ cm$^{-3}$ depending on the amount of impurities to be added.

According to one embodiment of the present invention, when the doping concentration of the base region increases from $1 \times 10^{18}$ cm$^{-3}$ to $1 \times 10^{19}$ cm$^{-3}$, the base region may generate latch-up and increase a latch-up voltage, and the state of the base region may be determined as "high" according to increase in a latch-up voltage.

According to one embodiment of the present invention, when the doping concentration of the base region increases from $1 \times 10^{16}$ cm$^{-3}$ to $1 \times 10^{17}$ cm$^{-3}$, the state of the base region is determined as "low".

According to one embodiment of the present invention, the concentration of ions for forming the first-type high-concentration semiconductor layer may be set to $1 \times 10^{20}$ cm$^{-3}$, and the ions may be injected to form the cathode layer.

According to one embodiment of the present invention, the concentration of ions for forming the second-type high-concentration semiconductor layer may be set to $1 \times 10^{20}$ cm$^{-3}$, and the ions may be injected to form the anode layer.

According to one embodiment of the present invention, the first-type low-concentration semiconductor layer and the second-type low-concentration semiconductor layer may each be formed to have a thickness of 80 nm or more.

In accordance with another aspect of the present invention, provided is a method of fabricating a two-terminal vertical 1T-DRAM including a step of forming a cathode layer formed of a first-type high-concentration semiconductor layer; a step of forming a base region including a second-type low-concentration semiconductor layer formed on the cathode layer and a first-type low-concentration semiconductor layer formed on the second-type low-concentration semiconductor layer; and a step of forming an anode layer formed of a second-type high-concentration semiconductor layer on the first-type low-concentration semiconductor layer.

According to one embodiment of the present invention, the step of forming a base region may include a step of adjusting the doping concentration of the base region so that the doping concentration of the base region increases from $1 \times 10^{16}$ cm$^{-3}$ to $1 \times 10^{17}$ cm$^{-3}$ or from $1 \times 10^{18}$ cm$^{-3}$ to $1 \times 10^{19}$ cm$^{-3}$ depending on the amount of impurities to be added.

According to one embodiment of the present invention, the step of adjusting the doping concentration of the base region so that the doping concentration of the base region increases from $1 \times 10^{18}$ cm$^{-3}$ to $1 \times 10^{19}$ cm$^{-3}$ may include a step of generating latch-up according to increase in the doping concentration of the base region and increasing a latch-up voltage; and a step of determining the state of the base region as "high" according to increase in a latch-up voltage.

According to one embodiment of the present invention, the step of adjusting the doping concentration of the base region so that the doping concentration of the base region increases from $1 \times 10^{16}$ cm$^{-3}$ to $1 \times 10^{17}$ cm$^{-3}$ may include a step of determining the state of the base region as "low" according to increase in the doping concentration of the base region.

According to one embodiment of the present invention, the first-type low-concentration semiconductor layer and the second-type low-concentration semiconductor layer may each be formed to have a thickness of 80 nm or more.

Advantageous Effects

According to one embodiment of the present invention, the two-terminal vertical 1T-DRAM has a two-terminal structure including a cathode terminal and an anode terminal and not including a gate terminal, and is formed by vertically laminating a first-type high-concentration semiconductor layer, a second-type low-concentration semiconductor layer, a first-type low-concentration semiconductor layer, and a second-type high-concentration semiconductor layer. The doping concentration of a base region including the first-type low-concentration semiconductor layer and the second-type low-concentration semiconductor layer can be optimized by changing the doping concentration of the base region.

In addition, according to one embodiment of the present invention, in the two-terminal vertical 1T-DRAM, by optimizing the doping concentration of the base region, read and write operations can be performed without a gate terminal.

In addition, according to one embodiment of the present invention, in the two-terminal vertical 1T-DRAM, by optimizing the doping concentration of the base region, the thickness of the two-terminal vertical 1T-DRAM can be reduced.

In addition, according to one embodiment of the present invention, in the two-terminal vertical 1T-DRAM, by optimizing the doping concentration of the base region, the two-terminal vertical 1T-DRAM can replace a 10 nm-scale DRAM.

In addition, according to one embodiment of the present invention, in the two-terminal vertical 1T-DRAM, by optimizing the doping concentration of the base region, the physical limitations of conventional DRAM technologies can be overcome.

DESCRIPTION OF DRAWINGS

FIG. 1 illustrates a two-terminal vertical 1-T DRAM according to one embodiment of the present invention.

FIG. 2 is a flowchart showing a method of fabricating a two-terminal vertical 1-T DRAM according to one embodiment of the present invention.

FIG. 3 illustrates an array of two-terminal vertical 1-T DRAMs according to one embodiment of the present invention.

FIG. 4A-4C includes graphs showing the device characteristics of a two-terminal vertical 1-T DRAM according to one embodiment of the present invention.

BEST MODE

Hereinafter, the embodiments will be described in detail herein with reference to the drawings.

It should be understood that the present invention is not limited to the embodiments according to the concept of the present invention, but includes changes, equivalents, or alternatives falling within the spirit and scope of the present invention.

In the following description of the present invention, a detailed description of known functions and configurations incorporated herein will be omitted when it may make the subject matter of the present invention unclear.

The terms used in the specification are defined in consideration of functions used in the present invention, and can be changed according to the intent or conventionally used methods of clients, operators, and users. Accordingly, definitions of the terms should be understood on the basis of the entire description of the present specification.

In description of the drawings, like reference numerals may be used for similar elements.

The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), it may be directly connected or coupled to the other element or an intervening element (e.g., third) may be present.

As used herein, "configured to" may be used interchangeably with, for example, "suitable for", "ability to", "changed to", "made to", "capable of", or "designed to" in terms of hardware or software.

In some situations, the expression "device configured to" may mean that the device "may do ~" with other devices or components.

For example, in the sentence "processor configured to perform A, B, and C", the processor may refer to a general purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or".

That is, unless otherwise mentioned or clearly inferred from context, the expression "x uses a or b" means any one of natural inclusive permutations.

FIG. 1 illustrates a two-terminal vertical 1-T DRAM according to one embodiment of the present invention.

Specifically, FIG. 1 illustrates a laminated structure of a two-terminal vertical 1-T DRAM according to one embodiment of the present invention.

Referring to FIG. 1, a two-terminal vertical 1-T DRAM 100 includes a first-type high-concentration cathode layer 110, a second-type low-concentration semiconductor layer 120, a first-type low-concentration semiconductor layer 130, a second-type high-concentration semiconductor layer 140, and an anode layer, which are vertically laminated on a substrate using an epitaxial method.

According to another embodiment, the two-terminal vertical 1-T DRAM 100 may further include an insulating oxide film embedded between the substrate and the first-type high-concentration cathode layer 110.

For example, the embedded insulating oxide film may be formed to protect the substrate from impurities generated from the substrate during a process.

The two-terminal vertical 1-T DRAM 100 may include the first-type high-concentration semiconductor layer as a cathode layer.

That is, the first-type high-concentration cathode layer 110 may be a cathode layer formed by injecting ions for forming the first-type high-concentration semiconductor layer.

According to one embodiment of the present invention, the second-type low-concentration semiconductor layer 120 laminated on the first-type high-concentration cathode layer 110 and the first-type low-concentration semiconductor layer 130 laminated on the second-type low-concentration semiconductor layer 120 are included in the base region of the two-terminal vertical 1-T DRAM 100.

According to one embodiment of the present invention, doping concentration may change depending on the concentration of impurities added to the base region of the two-terminal vertical 1-T DRAM 100.

According to one embodiment of the present invention, in the two-terminal vertical 1-T DRAM 100, the doping concentration of the base region may increase from $1\times10^{16}$ cm$^{-3}$ to $1\times10^{17}$ cm$^{-3}$ or from $1\times10^{18}$ cm$^{-3}$ to $1\times10^{19}$ cm$^{-3}$ depending on the concentration of impurities added to the base region.

According to one embodiment of the present invention, when the doping concentration of the base region increases from $1\times10^{18}$ cm$^{-3}$ to $1\times10^{19}$ cm$^{-3}$, the two-terminal vertical 1-T DRAM 100 may generate latch-up and increase a latch-up voltage, and the state of the base region may be determined as "high" according to increase in a latch-up voltage.

According to one embodiment of the present invention, when the doping concentration of the base region increases from $1\times10^{16}$ cm$^{-3}$ to $1\times10^{17}$ cm$^{-3}$, the two-terminal vertical 1-T DRAM 100 may determine the state of the base region as "low".

That is, depending on the presence or absence of increase in a latch-up voltage, the two-terminal vertical 1-T DRAM 100 may determine the state of the base region as "high" or "low", and may write "high" or "low" to the base region or read "high" or "low" from the base region.

That is, the two-terminal vertical 1-T DRAM 100 may perform a memory operation in the base region of the two-terminal vertical 1-T DRAM 100 depending on the presence or absence of increase in a latch-up voltage.

According to another embodiment of the present invention, when a fluctuating voltage is greater than or equal to a reference value depending on the presence or absence of increase in a latch-up voltage, the two-terminal vertical 1-T DRAM 100 may determine the state of the base region as "high". When a fluctuating voltage is less than or equal to a reference value depending on the presence or absence of increase in a latch-up voltage, the two-terminal vertical 1-T DRAM 100 may determine the state of the base region as "low".

In the two-terminal vertical 1-T DRAM 100 according to one embodiment of the present invention, when the doping concentration of the base region of the two-terminal vertical 1-T DRAM 100 increases, a junction barrier increases, and a latch-up voltage may increase as the junction barrier increases.

The two-terminal vertical 1-T DRAM 100 according to one embodiment of the present invention includes the second-type high-concentration semiconductor layer 140 laminated on the first-type low-concentration semiconductor layer 130. For example, two-terminal vertical 1-T DRAM may include the p$^+$-type semiconductor layer 140 as an anode layer 150.

The two-terminal vertical 1-T DRAM 100 according to one embodiment of the present invention may be configured as a two-terminal structure that includes a cathode layer corresponding to a cathode terminal and an anode layer corresponding to an anode terminal and does not include a gate terminal by performing a memory operation in accordance with adjustment of the doping concentration of the base region including the second-type low-concentration semiconductor layer 120 and the first-type low-concentration semiconductor layer 130.

That is, the two-terminal vertical 1-T DRAM 100 according to one embodiment of the present invention may perform a memory operation while excluding a gate terminal for changing the voltage of the base region by changing a voltage for performing a memory operation according to adjustment of the doping concentration of the base region including the second-type low-concentration semiconductor layer 120 and the first-type low-concentration semiconductor layer 130.

The two-terminal vertical 1-T DRAM 100 according to one embodiment of the present invention may be formed in a structure in which a word line is formed on the anode layer 150 and a bit line is laminated on the word line.

The first-type high-concentration semiconductor layer 110 according to one embodiment of the present invention includes one of an n$^+$-type semiconductor layer and a p$^+$-type semiconductor layer, and the second-type high-concentration semiconductor layer 140 includes one of an n$^+$-type semiconductor layer and a p$^+$-type semiconductor layer.

That is, when the first-type high-concentration semiconductor layer 110 is an n$^+$-type semiconductor layer, the second-type high-concentration semiconductor layer 140 may be a p$^+$-type semiconductor layer. On the contrary, when the first-type high-concentration semiconductor layer 110 is a p$^+$-type semiconductor layer, the second-type high-concentration semiconductor layer 140 may be an n$^+$-type semiconductor layer.

According to one embodiment of the present invention, the first-type low-concentration semiconductor layer 130 may include one of a p-type semiconductor layer and an n-type semiconductor layer, and the second-type low-concentration semiconductor layer 120 may include one of a p-type semiconductor layer and an n-type semiconductor layer.

That is, when the first-type low-concentration semiconductor layer 130 is a p-type semiconductor layer, the second-type low-concentration semiconductor layer 120 may be an n-type semiconductor layer. On the contrary, when the first-type low-concentration semiconductor layer 130 is an n-type semiconductor layer, the second-type low-concentration semiconductor layer 120 may be a p-type semiconductor layer.

The two-terminal vertical 1-T DRAM according to one embodiment of the present invention may include silicon channels consisting of the first-type high-concentration semiconductor layer 110, the second-type low-concentration semiconductor layer 120, the first-type low-concentration semiconductor layer 130, and the second-type high-concentration semiconductor layer 140.

According to one embodiment of the present invention, "high" may denote "1", and "low" may denote "0".

That is, the state of the base region of the two-terminal vertical 1T-DRAM may be determined as "1" or "0" depending on the doping concentration of the base region.

FIG. 2 is a flowchart showing a method of fabricating a two-terminal vertical 1-T DRAM according to one embodiment of the present invention.

Specifically, FIG. 2 shows a process for fabricating a two-terminal vertical 1-T DRAM according to one embodiment of the present invention as a thyristor-based two-terminal vertical structure using an epitaxial method.

Referring to FIG. 2, according to the method of fabricating a two-terminal vertical 1-T DRAM, in Step 201, an insulated oxide film embedded in a substrate is formed.

For example, the substrate may include any one of a silicon on insulator (SOI) wafer, a germanium on insulator (GOI) wafer, a strained germanium on insulator (SGOI) wafer, and a strained silicon on insulator (SSOI) wafer.

For example, since the embedded insulated oxide film has high insulating properties and is chemically stable, the embedded insulated oxide film may prevent diffusion of various impurities contained in silicon crystals when a transistor is fabricated, and may protect a wafer from impurities generated during a process.

According to the method of fabricating a two-terminal vertical 1-T DRAM, in Step 203, a first-type high-concentration semiconductor layer is formed as a cathode layer.

In the method of fabricating a two-terminal vertical 1-T DRAM according to one embodiment of the present invention, ions for forming the first-type high-concentration semiconductor layer on the embedded insulated oxide film are injected, and the first-type high-concentration semiconductor layer is formed as a cathode layer.

For example, according to the method of fabricating a two-terminal vertical 1-T DRAM, silicon, germanium, silicon-germanium, silicon-carbide, gallium arsenide, indium-gallium-arsenide, and gallium nitride may be used as a material for forming a cathode layer.

In the method of fabricating a two-terminal vertical 1-T DRAM according to one embodiment of the present invention, the concentration of ions for forming the first-type high-concentration semiconductor layer may be set to $1 \times 10^{20}$ cm$^{-3}$, and then the ions may be injected to form a cathode layer.

In the apparatus for fabricating a two-terminal vertical 1-T DRAM according to one embodiment of the present invention, the doping concentration of the first-type high-concentration semiconductor layer may be set to $1 \times 10^{20}$ cm$^{-3}$.

According to the method of fabricating a two-terminal vertical 1-T DRAM, in Step 205, a second-type low-concentration semiconductor layer and a first-type low-concentration semiconductor layer are formed.

In the method of fabricating a two-terminal vertical 1-T DRAM according to one embodiment of the present invention, ions for forming the second-type low-concentration semiconductor layer on the cathode layer are injected to form the second-type low-concentration semiconductor layer, and ions for forming the first-type low-concentration semiconductor layer on the second-type low-concentration semiconductor layer are injected to form the first-type low-concentration semiconductor layer.

In the method of fabricating a two-terminal vertical 1-T DRAM according to one embodiment of the present invention, the concentration of ions for forming the second-type low-concentration semiconductor layer and the concentration of ions for forming the first-type low-concentration semiconductor layer may be adjusted using impurities to adjust the doping concentration of the base region including the second-type low-concentration semiconductor layer and the first-type low-concentration semiconductor layer.

For example, the impurities may be used to change the physical properties of crystals forming the semiconductor layers or increase the conductivity of the crystals.

That is, according to the method of fabricating a two-terminal vertical 1-T DRAM, the doping concentration of the base region may be adjusted by adding impurities to the second-type low-concentration semiconductor layer and the first-type low-concentration semiconductor layer.

According to one embodiment of the present invention, the doping concentration of the base region may be obtained by dividing the ion concentration of the first-type low-concentration semiconductor layer by the ion concentration of the second-type low-concentration semiconductor layer.

In the method of fabricating a two-terminal vertical 1-T DRAM according to one embodiment of the present invention, the doping concentration of the base region of the two-terminal vertical 1-T DRAM may increase from $1 \times 10^{16}$ cm$^{-3}$ to $1 \times 10^{17}$ cm or from $1 \times 10^{18}$ cm$^{-3}$ to $1 \times 10^{19}$ cm$^{-3}$ by impurities.

In the method of fabricating a two-terminal vertical 1-T DRAM according to one embodiment of the present invention, when the doping concentration of the base region increases from $1 \times 10^{18}$ cm$^{-3}$ to $1 \times 10^{19}$ cm$^{-3}$, the two-terminal vertical 1T-DRAM generates latch-up and increases a latch-up voltage as the doping concentration of the base region of the two-terminal vertical 1T-DRAM increases.

In the two-terminal vertical 1-T DRAM according to one embodiment of the present invention, the state of the base region may be determined as "high" according to increase in a latch-up voltage.

In the method of fabricating a two-terminal vertical 1-T DRAM according to one embodiment of the present invention, when the doping concentration of the base region increases from $1 \times 10^{16}$ cm$^{-3}$ to $1 \times 10^{17}$ cm$^{-3}$, latch-up may not be triggered as the doping concentration of the base region of the two-terminal vertical 1T-DRAM increases, and the state of the base region may be determined as "low".

In the two-terminal vertical 1-T DRAM according to one embodiment of the present invention, when the state of the base region is "high", a large amount of current is passed through the two-terminal vertical 1-T DRAM. When the state of the base region is "low", a small amount of current is passed through the two-terminal vertical 1-T DRAM.

In the method of fabricating a two-terminal vertical 1-T DRAM according to one embodiment of the present invention, the second-type low-concentration semiconductor layer and the first-type low-concentration semiconductor layer may each be formed to have a thickness of 80 nm or more.

According to the method of fabricating a two-terminal vertical 1-T DRAM, in Step 207, a second-type high-concentration semiconductor layer is formed as an anode layer.

In the method of fabricating a two-terminal vertical 1-T DRAM according to one embodiment of the present invention, ions for forming the second-type high-concentration semiconductor layer on the first-type low-concentration semiconductor layer are injected to form the second-type high-concentration semiconductor layer as an anode layer.

In the method of fabricating a two-terminal vertical 1-T DRAM according to one embodiment of the present invention, the concentration of ions for forming the second-type high-concentration semiconductor layer may be set to $1 \times 10^{20}$ cm$^{-3}$, and the ions may be injected to form the anode layer.

For example, according to the method of fabricating a two-terminal vertical 1-T DRAM, a word line may be formed on the anode layer.

For example, according to the method of fabricating a two-terminal vertical 1-T DRAM, the thyristor characteristics of the two-terminal vertical 1-T DRAM may be confirmed while varying the doping concentration of the base region from $1 \times 10^{16}$ cm$^{-3}$ to $1 \times 10^{19}$ cm$^{-3}$.

According to one embodiment of the present invention, the first-type high-concentration semiconductor layer includes one of an n$^+$-type semiconductor and a p$^+$-type semiconductor layer.

According to one embodiment of the present invention, the second-type high-concentration semiconductor layer includes one of an n$^+$-type semiconductor layer and a p$^+$-type semiconductor layer.

That is, when the first-type high-concentration semiconductor layer is an n$^+$-type semiconductor layer, the second-type high-concentration semiconductor layer may be a p$^+$-type semiconductor layer.

On the contrary, when the first-type high-concentration semiconductor layer is a p$^+$-type semiconductor layer, the second-type high-concentration semiconductor layer may be an n$^+$-type semiconductor layer.

According to one embodiment of the present invention, the first-type low-concentration semiconductor layer may include one of a p-type semiconductor layer and an n-type semiconductor layer.

According to one embodiment of the present invention, the second-type low-concentration semiconductor layer may include one of a p-type semiconductor layer and an n-type semiconductor layer.

That is, when the first-type low-concentration semiconductor layer is a p-type semiconductor layer, the second-type low-concentration semiconductor layer may be an n-type semiconductor layer.

On the contrary, when the first-type low-concentration semiconductor layer is an n-type semiconductor layer, the second-type low-concentration semiconductor layer may be a p-type semiconductor layer.

The two-terminal vertical 1-T DRAM according to one embodiment of the present invention may include silicon channels consisting of the first-type high-concentration semiconductor layer, the second-type low-concentration semiconductor layer, the first-type low-concentration semiconductor layer, and the second-type high-concentration semiconductor layer.

According to one embodiment of the present invention, ions for forming the first-type high-concentration semiconductor layer, the second-type high-concentration semiconductor layer, the first-type low-concentration semiconductor layer, and the second-type low-concentration semiconductor layer may include any one of silicon, germanium, silicon-germanium, silicon-carbide, gallium arsenide, indium-gallium-arsenide, and gallium nitride.

FIG. 3 illustrates an array of two-terminal vertical 1-T DRAMs according to one embodiment of the present invention.

Specifically, FIG. 3 illustrates an array consisting of two-terminal vertical 1-T DRAMs according to one embodiment of the present invention.

Referring to FIG. 3, in the array of two-terminal vertical 1-T DRAMs, a first-type high-concentration semiconductor layer 310 corresponding to the cathode layer of the two-terminal vertical 1-T DRAM may be connected to a ground, and a bit line 350 may be formed on a second-type high-concentration semiconductor layer 340 corresponding to the anode layer of the two-terminal vertical 1-T DRAM. In addition, although not shown in FIG. 3, a word line may be formed between the second-type high-concentration semiconductor layer 340 and the bit line 350.

That is, a word line may be formed on the second-type high-concentration semiconductor layer 340.

The two-terminal vertical 1-T DRAM according to one embodiment of the present invention may be vertically formed on a substrate, and may include a thyristor-based vertical structure including the first-type high-concentration semiconductor layer 310, a second-type low-concentration semiconductor layer 320, a first-type low-concentration semiconductor layer 330, and the second-type high-concentration semiconductor layer sequentially laminated or formed on the ground.

The two-terminal vertical 1-T DRAM according to one embodiment of the present invention may perform a memory operation by adjusting the doping concentration of a base region including the second-type low-concentration semiconductor layer and the first-type low-concentration semiconductor layer.

The two-terminal vertical 1-T DRAM according to one embodiment of the present invention may be connected to one or more other two-terminal vertical 1-T DRAMs via the ground or the bit line 350.

The two-terminal vertical 1-T DRAM according to one embodiment of the present invention may include a word line vertically formed on the second-type high-concentration semiconductor layer.

The two-terminal vertical 1-T DRAM according to one embodiment of the present invention may be connected to the ground via the first-type high-concentration semiconductor layer 310.

The two-terminal vertical 1-T DRAM according to one embodiment of the present invention may perform a memory operation according to adjustment of the doping concentration of the base region without using a gate terminal.

As the number of two-terminal vertical 1-T DRAMs included in the array of two-terminal vertical 1-T DRAMs according to one embodiment of the present invention increases, the efficiency of the array may be increased.

The base region of the two-terminal vertical 1-T DRAM included in the array of two-terminal vertical 1-T DRAMs according to one embodiment of the present invention may be formed to have a thickness of 80 nm or more.

The two-terminal vertical 1-T DRAM according to one embodiment of the present invention may include an $n^+$-type/p-type/n-type/$p^+$-type semiconductor junction structure.

A two-terminal vertical 1-T DRAM according to another embodiment of the present invention may include a $p^+$-type/n-type/p-type/$n^+$-type semiconductor junction structure.

According to one embodiment of the present invention, the first-type high-concentration semiconductor layer 310 includes one of an $n^+$-type semiconductor layer and a $p^+$-type semiconductor layer, the second-type high-concentration semiconductor layer 340 includes one of an $n^+$-type semiconductor layer and a $p^+$-type semiconductor layer, the first-type low-concentration semiconductor layer 330 includes one of an n-type semiconductor layer and a p-type semiconductor layer, and the second-type low-concentration semiconductor layer 320 includes one of an n-type semiconductor layer and a p-type semiconductor layer.

The two-terminal vertical 1-T DRAM according to one embodiment of the present invention may include silicon channels consisting of the first-type high-concentration semiconductor layer 310, the second-type low-concentration semiconductor layer 320, the first-type low-concentration semiconductor layer 330, and the second-type high-concentration semiconductor layer 340.

FIG. 4A-4C include graphs showing the device characteristics of a two-terminal vertical 1-T DRAM according to one embodiment of the present invention.

Specifically, FIGS. 4A, 4B, and 4C show the device characteristics of the two-terminal vertical 1-T DRAM according to one embodiment of the present invention depending on change in the doping concentration of the base region. As shown in FIGS. 4A, 4B, and 4C, it can be confirmed that an anode voltage changes according to change in anode current in the two-terminal vertical 1-T DRAM due to change in the doping concentration.

In graphs shown in FIGS. 4A, 4B, and 4C, the ordinate represents anode current, and the abscissa represents anode voltages.

Referring to FIG. 4A, in a legend 410 included in the graph, the doping concentrations of a base region of $1 \times 10^{17}$ $cm^{-3}$ to $9 \times 10^{17}$ $cm^{-3}$ are shown.

As shown in FIG. 4A, when the doping concentration of the base region of the two-terminal vertical 1-T DRAM increases from $1\times10^{16}$ cm$^{-3}$ to $1\times10^{17}$ cm$^{-3}$ to $9\times10^{17}$ cm$^{-3}$, the two-terminal vertical 1-T DRAM exhibits mono-stable I-V characteristics.

That is, when the doping concentration of the base region increases from $1\times10^{16}$ cm$^{-3}$ to $1\times10^{17}$ cm$^{-3}$ to $9\times10^{17}$ cm$^{-3}$, the two-terminal vertical 1-T DRAM according to one embodiment of the present invention exhibits mono-stable I-V characteristics and does not generate latch-up.

Referring to FIG. 4B, in a legend 420 included in the graph, the doping concentrations of a base region of $1\times10^{18}$ cm$^{-3}$ to $9\times10^{18}$ cm$^{-3}$ are shown.

FIG. 4B is a graph showing the results for a case wherein the doping concentration of the base region of the two-terminal vertical 1-T DRAM increases from $1\times10^{17}$ cm$^{-3}$ to $1\times10^{18}$ cm$^{-3}$ to $9\times10^{18}$ cm$^{-3}$.

When the doping concentration of the base region is $3\times10^{18}$ cm$^{-3}$ to $9\times10^{18}$ cm$^{-3}$, an anode voltage increases to approximately 1V to 2V in the anode current region between $1\times10^{-12}$ A and $1\times10^{-16}$ A.

Referring to FIG. 4C, in a legend 430 included in the graph, the doping concentrations of a base region of $1\times10^{19}$ cm$^{-3}$ to $9\times10^{19}$ cm$^{-3}$ are shown.

FIG. 4C is a graph showing a case wherein the doping concentration of the base region of the two-terminal vertical 1-T DRAM increases from $1\times10^{18}$ cm$^{-3}$ to $1\times10^{19}$ cm$^{-3}$ to $9\times10^{19}$ cm$^{-3}$.

As shown in FIG. 4C, when the doping concentration of the base region increases from $1\times10^{18}$ cm$^{-3}$ to $1\times10^{19}$ cm$^{-3}$, the two-terminal vertical 1-T DRAM exhibits bi-stable I-V characteristics, and an anode voltage increases from 0.47 V to 2.10 V in the anode current region between $1\times10^{-13}$ A and $1\times10^{-16}$ A as latch-up occurs.

In addition, as the doping concentration of the base region of the two-terminal vertical 1-T DRAM increases from $1\times10^{18}$ cm$^{-3}$ to $1\times10^{19}$ cm$^{-3}$, a junction barrier increases in an n$^+$-type/p-type/n-type/p$^+$-type semiconductor junction structure or a p$^+$-type/n-type/p-type/n$^+$-type semiconductor junction structure, which may increase an anode voltage (e.g., latch-up voltage).

In the above-described specific embodiments, elements included in the invention are expressed singular or plural in accordance with the specific embodiments shown.

It should be understood, however, that the singular or plural representations are to be chosen as appropriate to the situation presented for the purpose of description and that the above-described embodiments are not limited to the singular or plural constituent elements. The constituent elements expressed in plural may be composed of a single number, and constituent elements expressed in singular form may be composed of a plurality of elements.

In addition, the present invention has been described with reference to exemplary embodiments, but it should be understood that various modifications may be made without departing from the scope of the present invention.

Therefore, the scope of the present invention should not be limited by the embodiments, but should be determined by the following claims and equivalents to the following claims.

DESCRIPTION OF SYMBOLS

100: TWO-TERMINAL VERTICAL 1-T DRAM
110: FIRST-TYPE HIGH-CONCENTRATION CATHODE LAYER
120: SECOND-TYPE LOW-CONCENTRATION SEMICONDUCTOR LAYER
130: FIRST-TYPE LOW-CONCENTRATION SEMICONDUCTOR LAYER
140: SECOND-TYPE HIGH-CONCENTRATION SEMICONDUCTOR LAYER
150: ANODE LAYER
310: FIRST-TYPE HIGH-CONCENTRATION SEMICONDUCTOR LAYER
320: SECOND-TYPE LOW-CONCENTRATION SEMICONDUCTOR LAYER
330: FIRST-TYPE LOW-CONCENTRATION SEMICONDUCTOR LAYER
340: SECOND-TYPE HIGH-CONCENTRATION SEMICONDUCTOR LAYER
350: BIT LINE

The invention claimed is:

1. A two-terminal vertical 1T-DRAM, comprising:
a cathode layer formed of a first-type high-concentration semiconductor layer;
a base region comprising a second-type low-concentration semiconductor layer formed on the cathode layer and a first-type low-concentration semiconductor layer formed on the second-type low-concentration semiconductor layer; and
an anode layer formed of a second-type high-concentration semiconductor layer on the first-type low-concentration semiconductor layer,
wherein a doping concentration of the base region increases from $1\times10^{16}$ cm$^{-3}$ to $1\times10^{17}$ cm$^{-3}$ or from $1\times10^{18}$ cm$^{-3}$ to $1\times10^{19}$ cm$^{-3}$ depending on an amount of impurities to be added, and
wherein, when a doping concentration of the base region increases from $1\times10^{18}$ cm$^{-3}$ to $1\times10^{19}$ cm$^{-3}$, the base region generates latch-up and increases a latch-up voltage, and a state of the base region is determined as "high" according to increase in the latch-up voltage.

2. The two-terminal vertical 1T-DRAM according to claim 1, wherein
the first-type high-concentration semiconductor layer comprises one of an n$^+$-type semiconductor layer and a p$^+$-type semiconductor layer; and
the second-type high-concentration semiconductor layer comprises the other of the n$^+$-type semiconductor layer and the p$^+$-type semiconductor layer.

3. The two-terminal vertical 1T-DRAM according to claim 2, wherein the first-type high-concentration semiconductor layer is an n+-type semiconductor layer, and the second-type high-concentration semiconductor layer is a p+-type semiconductor layer.

4. The two-terminal vertical 1T-DRAM according to claim 2, wherein the first-type high-concentration semiconductor layer is the p+-type semiconductor layer, and the second-type high-concentration semiconductor layer is the n+-type semiconductor layer.

5. The two-terminal vertical 1T-DRAM according to claim 1, wherein
the first-type low-concentration semiconductor layer comprises one of a p-type semiconductor layer and an n-type semiconductor layer; and
the second-type low-concentration semiconductor layer comprises the other of the p-type semiconductor layer and the n-type semiconductor layer.

6. The two-terminal vertical 1T-DRAM according to claim 5, wherein the first-type low-concentration semiconductor layer is a p-type semiconductor layer, and the second-type low-concentration semiconductor layer is an n-type semiconductor layer.

7. The two-terminal vertical 1T-DRAM according to claim 5, wherein the first-type low-concentration semiconductor layer is the n-type semiconductor layer, and the second-type low-concentration semiconductor layer is the p-type semiconductor layer.

8. The two-terminal vertical 1T-DRAM according to claim 1, wherein, when the doping concentration of the base region increases from $1\times10^{16}$ cm$^{-3}$ to $1\times10^{17}$ cm$^{-3}$, state of the base region is determined as "low".

9. The two-terminal vertical 1T-DRAM according to claim 1, wherein a concentration of ions for forming the second-type high-concentration semiconductor layer is set to $1\times10^{20}$ cm$^{-3}$, and the ions are injected to form the anode layer.

10. The two-terminal vertical 1T-DRAM according to claim 1, wherein the first-type low-concentration semiconductor layer and the second-type low-concentration semiconductor layer are each formed to have a thickness of 80 nm or more.

11. A two-terminal vertical 1T-DRAM, comprising:
  a cathode layer formed of a first-type high-concentration semiconductor layer;
  a base region comprising a second-type low-concentration semiconductor layer formed on the cathode layer and a first-type low-concentration semiconductor layer formed on the second-type low-concentration semiconductor layer; and
  an anode layer formed of a second-type high-concentration semiconductor layer on the first-type low-concentration semiconductor layer,
  wherein a concentration of ions for forming the first-type high-concentration semiconductor layer is set to $1\times10^{20}$ cm$^{-3}$, and the ions are injected to form the cathode layer.

12. A method of fabricating a two-terminal vertical 1T-DRAM, comprising:
  a step of forming a cathode layer formed of a first-type high-concentration semiconductor layer;
  a step of forming a base region comprising a second-type low-concentration semiconductor layer formed on the cathode layer and a first-type low-concentration semiconductor layer formed on the second-type low-concentration semiconductor layer; and
  a step of forming an anode layer formed of a second-type high-concentration semiconductor layer on the first-type low-concentration semiconductor layer,
  wherein the step of forming the base region comprises a step of adjusting a doping concentration of the base region so that the doping concentration of the base region increases from $1\times10^{16}$ cm$^{-3}$ to $1\times10^{17}$ cm$^{-3}$ or from $1\times10^{18}$ cm$^{-3}$ to $1\times10^{19}$ cm$^{-3}$ depending on an amount of impurities to be added, and
  wherein the step of adjusting the doping concentration of the base region so that the doping concentration of the base region increases from $1\times10^{18}$ cm$^{-3}$ to $1\times10^{19}$ cm$^{-3}$ comprises a step of generating latch-up according to increase in the doping concentration of the base region and increasing a latch-up voltage; and
  a step of determining a state of the base region as "high" according to increase in the latch-up voltage.

13. The method according to claim 12, wherein the step of adjusting the doping concentration of the base region so that the doping concentration of the base region increases from $1\times10^{16}$ cm$^{-3}$ to $1\times10^{17}$ cm$^{-3}$ comprises a step of determining the state of the base region as "low" according to increase in the doping concentration of the base region.

14. The method according to claim 12, wherein the first-type low-concentration semiconductor layer and the second-type low-concentration semiconductor layer are each formed to have a thickness of 80 nm or more.

* * * * *